US012699832B2

(12) United States Patent
Chongala et al.

(10) Patent No.: US 12,699,832 B2
(45) Date of Patent: Aug. 4, 2026

(54) MULTI-PATH ROUTING IN A NETWORK ON CHIP

(71) Applicant: XILINX, INC., San Jose, CA (US)

(72) Inventors: Surya Rajendra Swamy Saranam Chongala, Srikakulam (IN); Nikhil Arun Dhume, Hyderbad (IN); Krishnan Srinivasan, San Jose, CA (US); Dinesh D. Gaitonde, Fremont, CA (US)

(73) Assignee: XILINX, INC., San Jose, CA (US)

( * ) Notice: Subject to any disclaimer, the term of this patent is extended or adjusted under 35 U.S.C. 154(b) by 863 days.

(21) Appl. No.: 17/979,649

(22) Filed: Nov. 2, 2022

(65) Prior Publication Data

US 2024/0143891 A1 May 2, 2024

(51) Int. Cl.
G06F 30/3953 (2020.01)

(52) U.S. Cl.
CPC ................................. G06F 30/3953 (2020.01)

(58) Field of Classification Search
CPC .................................................. G06F 30/3953
USPC .......................................................... 716/130
See application file for complete search history.

(56) References Cited

U.S. PATENT DOCUMENTS

| | | | | |
|---|---|---|---|---|
| 10,003,538 B2 * | 6/2018 | Avci | ...................... | H04L 47/125 |
| 2020/0092230 A1 * | 3/2020 | Schultz | ................. | H04L 49/109 |

OTHER PUBLICATIONS

International Search Report and Written Opinion for PCT/US2023/035113 dated Feb. 19, 2024.
Radu Stefan, et al., "Multi-path routing in time-division-multiplexed networks on chip", Very Large Scale Integration (VLSI-SOC), 2019 17th IFIP International Conference on IEEE, Oct. 12, 2009, pp. 109-114.
Piotr Dziurzanski, et al., "Stream Transfer Balancing Scheme Utilizing Multi-Path Routing in Networks on Chip", Reconfigurable Computing: Archirctures, tools and applications; Springer Berlin Heidelberg, Berlin, Heidelberg, pp. 294-299, Mar. 26, 2008.
Piotr Dziurzanski, et al., "Network on chips link bandwidth minimization of deadlock-free multi-path routing", 2013 20th International Conference on Systems, Signals and Image Processing (IWS-SIP), IEEE, May 12, 2014, pp. 131-134.
Zongliang Zhuansun, et al., "Multipath routing algorithm for application-specific wormhole NoCs", Concurrency and Cmputation: Practice and Experience, Wiley, London, GB, vol. 29, No. 16, Mar. 2017.
Yang, Yoon Seok et al. "Exploiting path diversity for low-latency and high-bandwidth with the dual-path NoC router." 2012 IEEE International Symposium on Circuits and Systems (2012): 2433-2436.

(Continued)

*Primary Examiner* — Eric D Lee
(74) *Attorney, Agent, or Firm* — Patterson + Sheridan, LLP

(57) ABSTRACT

Embodiments herein describe a network on chip (NoC) that implements multi-path routing (MPR) between an ingress logic block and an egress logic block. The multiple paths between the ingress and egress logic blocks can be assigned different alias destination IDs corresponding to the same destination ID. The NoC can use the alias destination IDs to route the packets along the different paths through interconnected switches in the NoC.

20 Claims, 7 Drawing Sheets

(56) References Cited

OTHER PUBLICATIONS

Yang, Y.S., et al. "SDPR: Improving Latency and Bandwidth in On-Chip Interconnect Through Simultaneous Dual-Path Routing," in IEEE Transactions on Computer-Aided Design of Integrated Circuits and Systems, vol. 37, No. 3, pp. 545-558, Mar. 2018.
Murali, S., et al. "A multi-path routing strategy with guaranteed in-order packet delivery and fault-tolerance for networks on chip," 2006 43rd ACM/IEEE Design Automation Conference, 2006, pp. 845-848.

* cited by examiner

MULTI-PATH ROUTING IN A NETWORK ON CHIP

TECHNICAL FIELD

Examples of the present disclosure generally relate to multi-path routing in a network on chip (NoC).

BACKGROUND

A system on chip (SoC) (e.g., a field programmable gate array (FPGA), a programmable logic device (PLD), or an application specific integrated circuit (ASIC)) can contain a packet network structure known as a NoC to route data packets between circuit elements in the SoC—e.g., programmable logic blocks, processors, memory, and the like.

The NoC can include ingress logic blocks (e.g., masters) that execute read or write requests to egress logic blocks (e.g., servants). Most solutions use single-path routing (SPR) where one path is selected to route all packets transferred between an ingress logic block and a selected egress logic block. That is, in SPR an ingress logic block uses only one path through the NoC to route data to an egress logic block.

Multi-path routing (MPR), in contrast, establishes multiple routes between an ingress logic block and an egress logic block. However, current MPR techniques generally rely on reordering buffers at the egress logic block to account for data that is received out of order due to different latencies in the multiple paths. Further, many solutions put routing information in the packets being transmitted, which increases packet overhead.

SUMMARY

One example is an integrated circuit that includes a first circuit element, a second circuit element, and a network on a chip (NoC) configured to communicatively couple the first and second circuit elements. The NoC is configured to receive, at an ingress logic block, a packet from the first circuit element to be transmitted to the second circuit element, determine that a destination of the packet uses multi-path routing (MPR) in the NoC, and assign an alias destination ID corresponding to the destination based on a desired bandwidth usage ratio of a plurality of paths used to transmit data from the ingress logic block to an egress logic block in the NoC where each of the plurality of paths between the ingress logic block and the egress logic block has a different alias destination ID.

Another example is a method that includes receiving, at an ingress logic block of a NoC, a packet from a first circuit element to be transmitted to a second circuit element coupled to the NoC, determining that a destination of the packet uses multi-path routing (MPR) in the NoC, and assigning an alias destination ID corresponding to the destination based on a desired bandwidth usage ratio of a plurality of paths used to transmit data from the ingress logic block to an egress logic block in the NoC, wherein each of the plurality of paths between the ingress logic block and the egress logic block has a different alias destination ID.

Another example is an integrated circuit that includes a first circuit element assigned a first ID, a second circuit element assigned a second ID different from the first ID, and a NoC. The NoC includes an ingress logic block configured to receive packets from the first and second circuit elements to transmit through the NoC to a same egress logic block in the NoC where the ingress logic block is configured to assign a first alias destination ID corresponding to a first path through the NoC used by packets received from the first circuit element to reach the egress logic block and assign a second alias destination ID corresponding to a second path through the NoC used by packets received from the second circuit element to reach the egress logic block.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
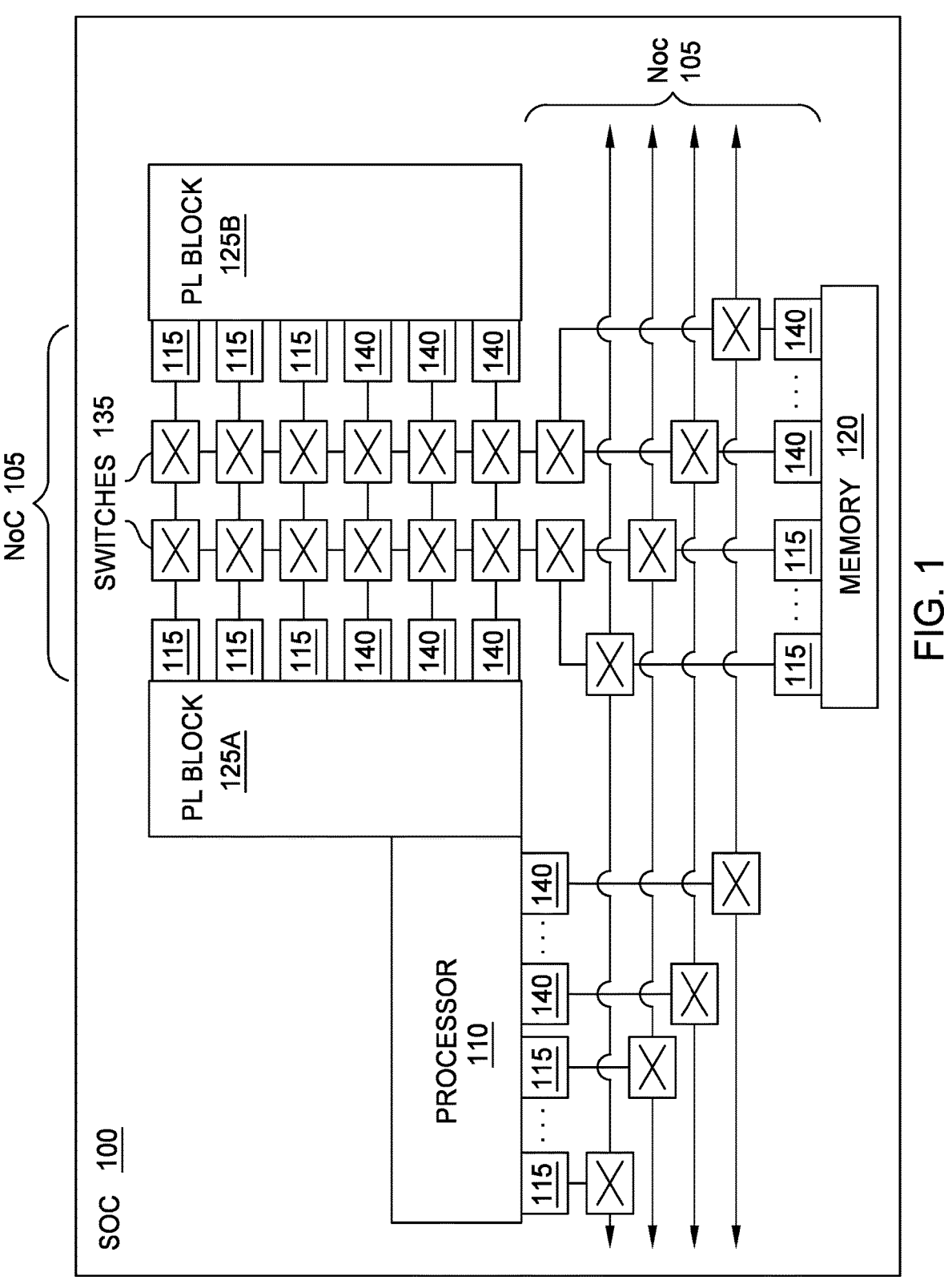
FIG. 1 is a block diagram of a SoC containing a NoC, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the examples below or as a limitation on the scope of the claims, in addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe a NoC that implements MPR between an ingress logic block and an egress logic block. In one embodiment, if during configuration, a router determines the NoC does not have a single path that has sufficient available bandwidth to satisfy the amount of traffic that an ingress logic block needs to send to an egress logic block, the router uses MPR by identifying sufficient available bandwidth in multiple paths in the NoC.

In one embodiment, an ingress logic block may service multiple components (e.g., circuit elements) that are assigned different IDs (e.g., different advanced extensible interface (AXI) IDs). If there are paths that have sufficient available bandwidth for the traffic generated by each of the components, then the router can assign the flow for each component to a respective one of the paths using alias destination IDs. For example, the traffic received at the ingress logic block for Component 1 may be assigned Alias ID 1 and routed using Path 1 in the NoC to the egress logic block. The traffic received at the ingress logic block for Component 2 may be assigned Alias ID 2 and routed using Path 2 in the NoC to the same egress logic block, and so forth.

However, if the ingress logic block does not service multiple components or the NoC does not have respective paths that have sufficient available bandwidth for the flows generated by the multiple components, then a different MPR technique can be used. In this example, multiple paths can be selected where their aggregate available bandwidth satisfies the bandwidth requirements of the connection between the ingress logic block and the selected egress logic block. The ingress logic block can then assign packets to different alias IDs corresponding to the different paths. For example, if Path 1 provides two thirds of the bandwidth while Path 2 provides one third of the bandwidth between the ingress and egress logic blocks, then the ingress logic block can assign every two packets to the alias ID for Path 1 for every one packet it assigns to the alias ID for Path 2. Further, because ordering can matter for packets that have overlapping addresses, the ingress logic block can ensure that packets that have overlapping addresses are sent on the same path so they are received in order at the egress logic block.

FIG. 1 is a block diagram of the SoC 100 containing a NoC 105, according to an example. In one embodiment, the SoC 100 is implemented using a single integrated circuit (IC). In one embodiment, the SoC 100 includes a mix of hardened and programmable logic. For example, the NoC 105 may be formed using hardened circuitry rather than programmable circuitry so that its footprint in the SoC 100 is reduced.

As shown, the NoC 105 interconnects a programmable logic (PL) block 125A, a PL block 125B, a processor 110, and a memory 120. That is, the NoC 105 can be used in the SoC 100 to permit different hardened and programmable circuit elements in the SoC 100 to communicate. For example, the PL block 125A may use one ingress logic block 115 (also referred to as a NoC Master Unit (NMU)) to communicate with the PL block 125B and another ingress logic block 115 to communicate with the processor 110. However, in another embodiment, the PL block 125A may use the same ingress logic block 115 to communicate with both the PL block 125B and the processor 110 (assuming the endpoints use the same communication protocol). The PL block 125A can transmit the data to the respective egress logic blocks 140 (also referred to as NoC Slave Units or NoC Servant Units (NSU)) for the PL block 125B and the processor 110 which can determine whether the data is intended for them based on an address (if using a memory mapped protocol) or a destination ID (if using a streaming protocol).

The PL block 125A may include egress logic blocks 140 for receiving data transmitted by the PL block 125B and the processor 110. In one embodiment, the hardware logic blocks (or hardware logic circuits) are able to communicate with all the other hardware logic blocks that are also connected to the NoC 105, but in other embodiments, the hardware logic blocks may communicate with only a subportion of the other hardware logic blocks connected to the NoC 105. For example, the memory 120 may be able to communicate with the PL block 125A but not with the PL block 125B.

As described above, the ingress and egress logic blocks 115, 140 may all use the same communication protocol to communicate with the PL blocks 125, the processor 110, and the memory 120, or can use different communication protocols. For example, the PL block 125A may use a memory mapped protocol to communicate with the PL block 125B while the processor 110 uses a streaming protocol to communicate with the memory 120. In one embodiment, the NoC 105 can support multiple protocols.

In one embodiment, the SoC 100 is an FPGA which configures the PL blocks 125 according to a user design. That is, in this example, the FPGA includes both programmable and hardened logic blocks. However, in other embodiments, the SoC 100 may be an ASIC that includes only hardened logic blocks. That is, the SoC 100 may not include the PL blocks 125. Even though in that example the logic blocks are non-programmable, the NoC 105 may still be programmable so that the hardened logic blocks—e.g., the processor 110 and the memory 120 can switch between different communication protocols, change data widths at the interface, or adjust the frequency.

In addition, FIG. 1 illustrates the connections and various switches 135 (labeled as boxes with "X") used by the NoC 105 to route packets between the ingress and egress logic blocks 115 and 140.

The locations of the PL blocks 125, the processor 110, and the memory 120 in the physical layout of the SoC 100 are just one example of arranging these hardware elements. Further, the SoC 100 can include more hardware elements than shown. For instance, the SoC 100 may include additional PL blocks, processors, and memory that are disposed at different locations on the SoC 100. Further, the SoC 100 can include other hardware elements such as I/O modules and a memory controller which may, or may not, be coupled to the NoC 105 using respective ingress and egress logic blocks 115 and 140. For example, the I/O modules may be disposed around a periphery of the SoC 100.

Figure 2A:
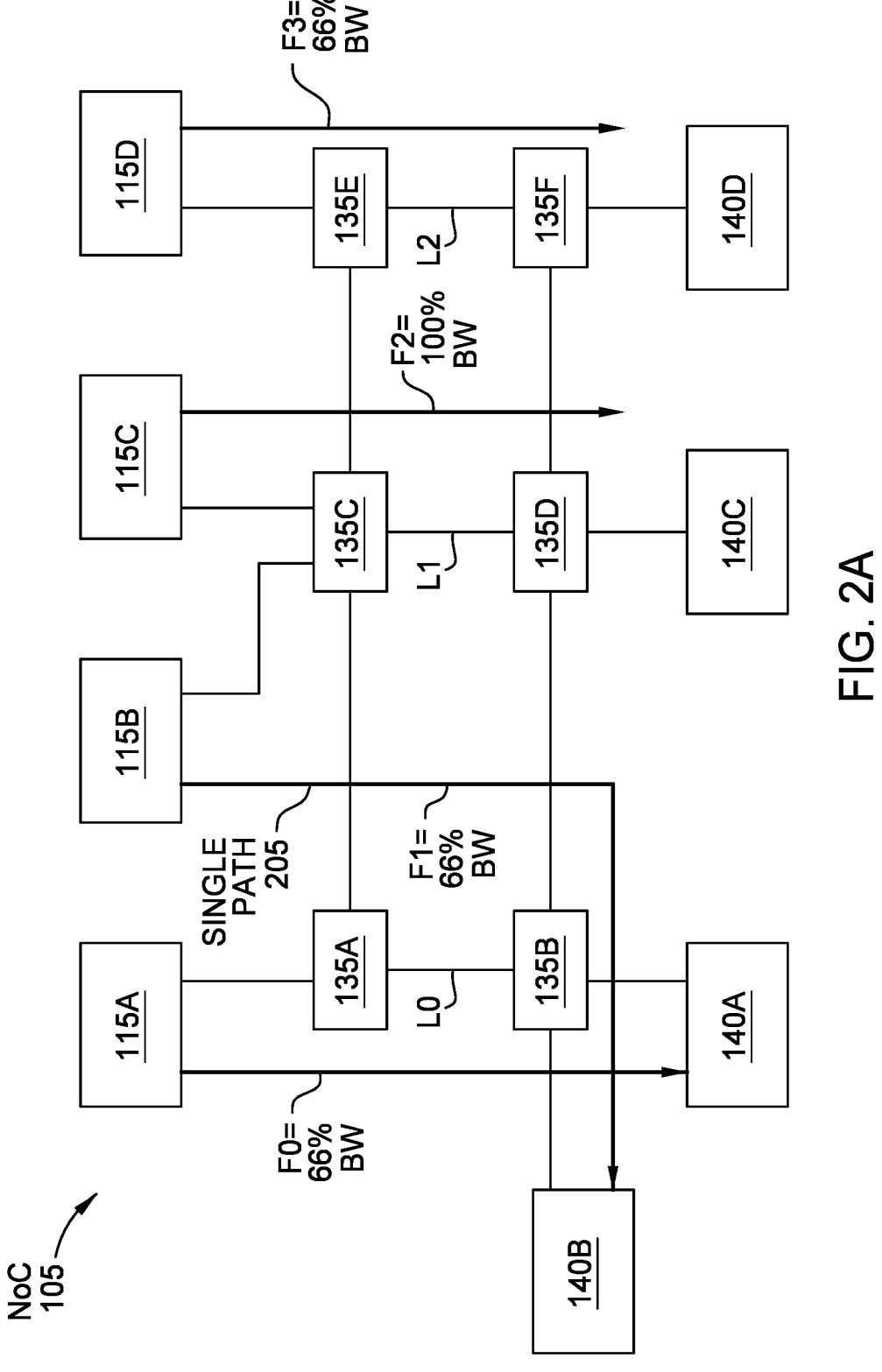
FIG. 2A illustrates a NoC that lacks sufficient link bandwidth for performing SPR, according to an example.

FIG. 2A illustrates a portion of the NoC 105 that lacks sufficient link bandwidth for performing SPR, according to an example. FIG. 2A illustrates attempting to configure the NoC 105 such that the ingress logic blocks 115A-D can have respective connections to the egress logic blocks 140A-D. In this case, a router (e.g., a software application stored in memory and executing by one or more processors in a computing system) attempts to configure the NoC 105 so that the ingress logic block 115A has a connection through the NoC 105 to the egress logic block 140A, the ingress logic block 115B has a connection through the NoC 105 to the egress logic block 140B, the ingress logic block 115C has a connection through the NoC 105 to the egress logic block 140C, and the ingress logic block 115D has a connection through the NoC 105 to the egress logic block 140D.

In this case, the connection between the ingress and egress logic blocks 115A and 140B uses 66% of the bandwidth in the Link 0 (L0) between the switches 135A and 135B, the connection between the ingress and egress logic blocks 115C and 140C uses 100% of the bandwidth in the Link 1 (L1) between the switches 135C and 135B, and the connection between the ingress and egress logic blocks 115D and 140D uses 66% of the bandwidth in the Link 2 (L2) between the switches 135E and 135F. However, as shown, the path 205 between the ingress logic block 115B and the egress logic block 140E also needs to use 66% of the bandwidth of L0. Because the connection between the ingress logic block 115A and the egress logic block 140A has already been assigned to L0 by the router, this link does not have sufficient available bandwidth for the connection between the egress logic block 115B and the egress logic block 140B.

Moreover, the router can also consider routing the path 205 between the egress logic block 115B and the egress logic block 140B using the other links L1 and L2. However, these links also do not have sufficient available bandwidth. Thus, when using SPR, FIG. 2A illustrates a scenario where not all the connections can be routed.

Figure 2B:
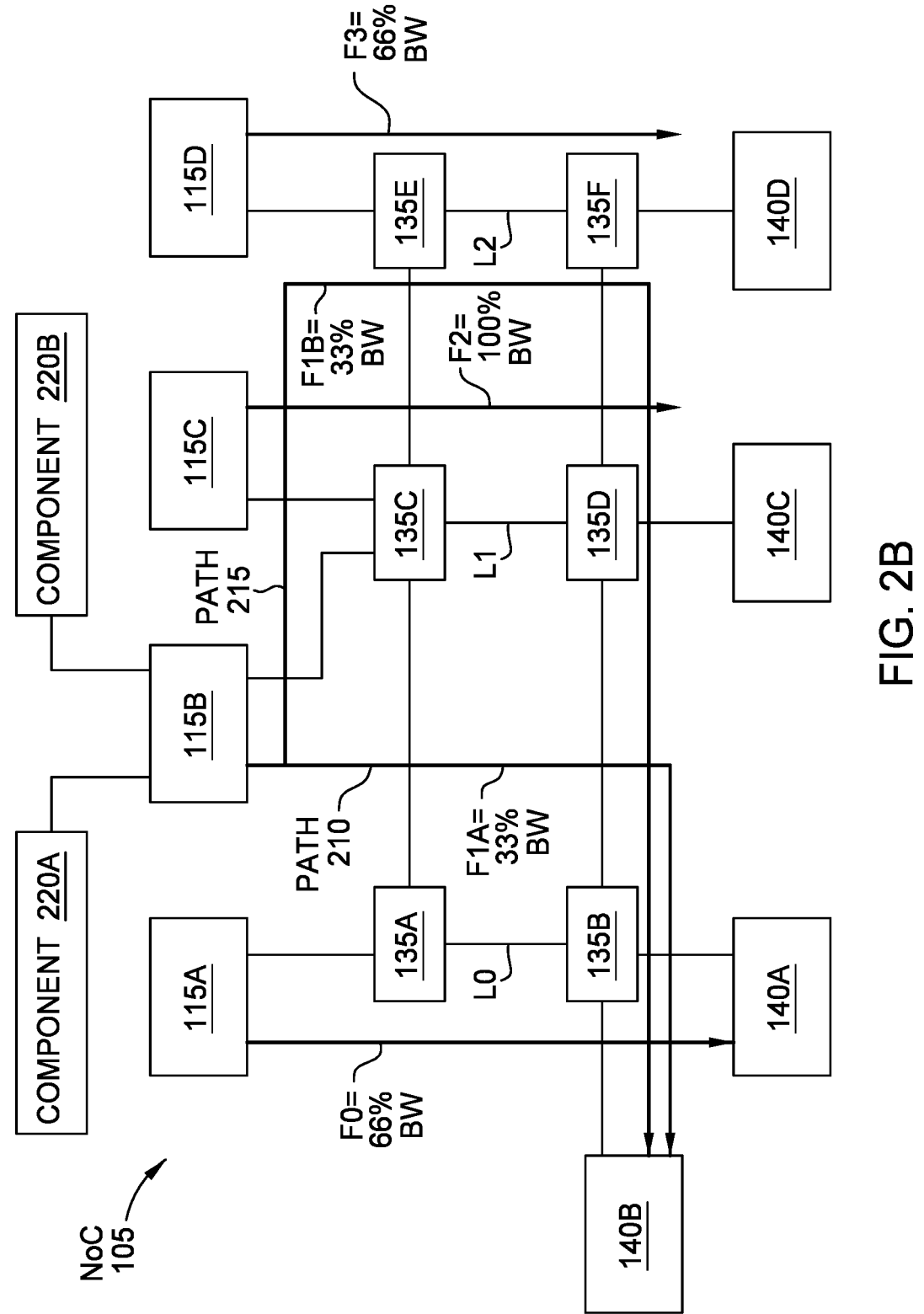
FIG. 2B illustrates using MPR to solve the routing problem in FIG. 2A, according to an example.

FIG. 2B illustrates using MPR to solve the routing problem in FIG. 2A, according to an example. That is, all the connections in FIG. 2A can be routed if the NoC 105 supports MPR. In FIG. 2B, the traffic for the connection between the ingress logic block 115B and the egress logic block 140B is split where half of the traffic uses L0 along path 210 and the other half uses L2 along path 215. That is, the paths 210 and 215 use different sets of switches 135 to reach the egress logic block 140B. Thus, FIG. 2B illustrates that MPR can be used where any single path or connection through the NoC 105 does not satisfy the bandwidth requirements between an ingress logic block 115 and an egress logic block 140. Instead, multiple paths can be identified where their aggregate available bandwidth meets or exceed the bandwidth requirement for the pair of ingress and egress logic blocks.

The discussion below describe multiple techniques for performing MPR in a NoC.

Figure 3:
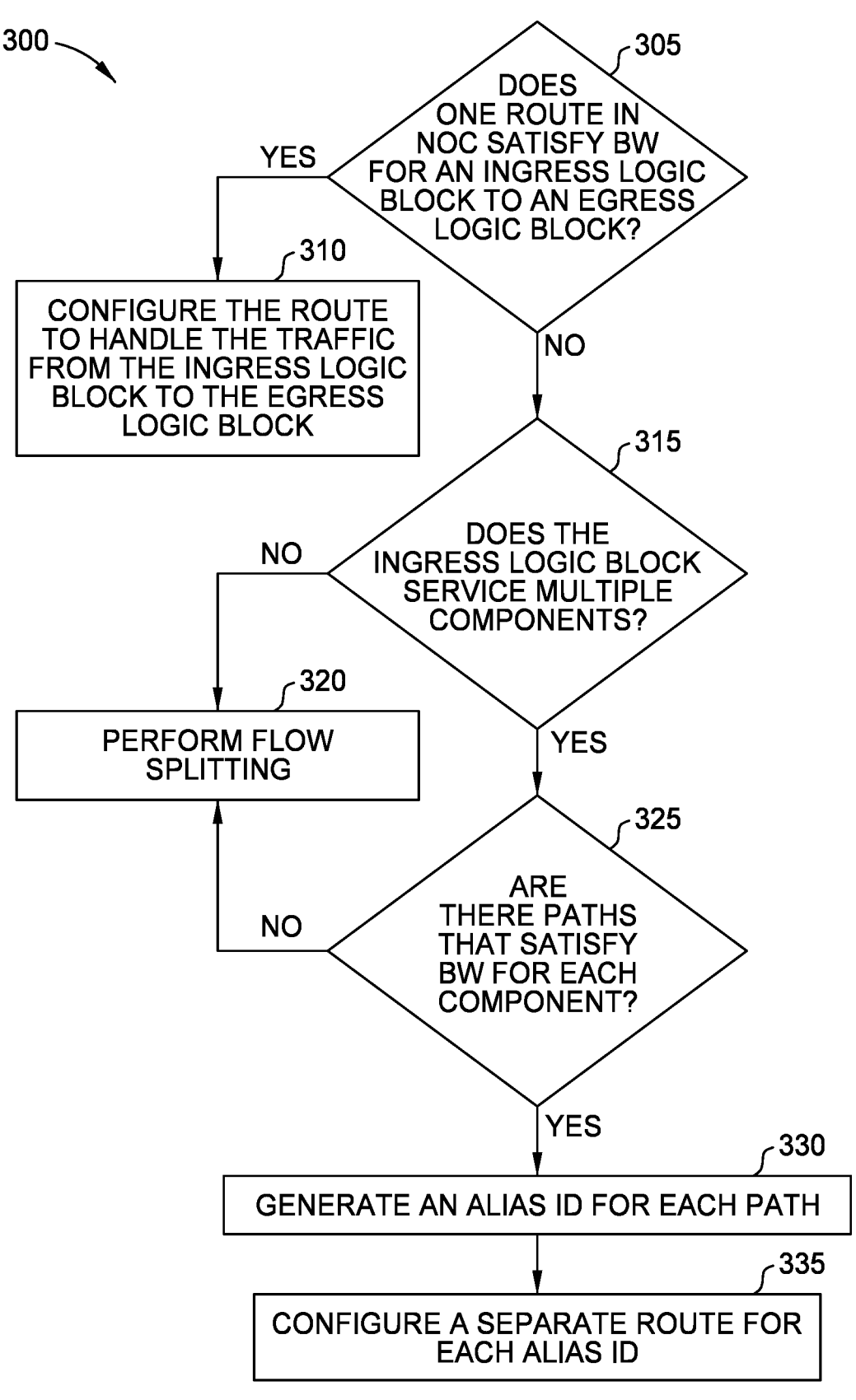
FIG. 3 is a flowchart for performing MPR, according to an example.

FIG. 3 is a flowchart of a method 300 for performing MPR, according to an example. At block 305, the router determines whether one route in a NoC satisfies the bandwidth (BW) for a connection between an ingress logic block and an egress logic block. If so, the method 300 proceeds to block 310 where the router assigns that route to be used by the ingress logic block to exchange packets with the egress logic block. That is, a single route in the NoC has sufficient available bandwidth to satisfy the bandwidth requirements between the ingress logic block and the egress logic block.

However, assuming the NoC does not have a single route that has sufficient available bandwidth, the method 300 proceeds to block 315 where the route determines whether the ingress logic block services multiple components. In some hardware deployments an ingress logic block may service multiple components (e.g., masters) such as peripheral devices that are assigned respective IDs (i.e., different AXI IDs). FIG. 2B illustrates two components 220A and 220B connected to the ingress logic block 115B. These components 220A and 220B may be assigned different AXI IDs.

In AXI, transactions corresponding to the same component 220 should arrive at the destination in the order in which the transactions are issued, irrespective of their addresses. That is, all the packets generated by the ingress logic block 115B at the behest of the component 220A should reach the egress logic block 140B in the same order those packets were transmitted by the ingress logic block 115B. In contrast, transactions from components with different IDs to the same destination are independent and responses can be issued in any order. For example, if the ingress logic block 115B first transmits a packet for component 220A and then later transmits a packet for component 220B, the packet for component 220B can arrive at the egress logic block 140B before the packet for component 220A without violating any AXI ordering constraints.

Figure 5:
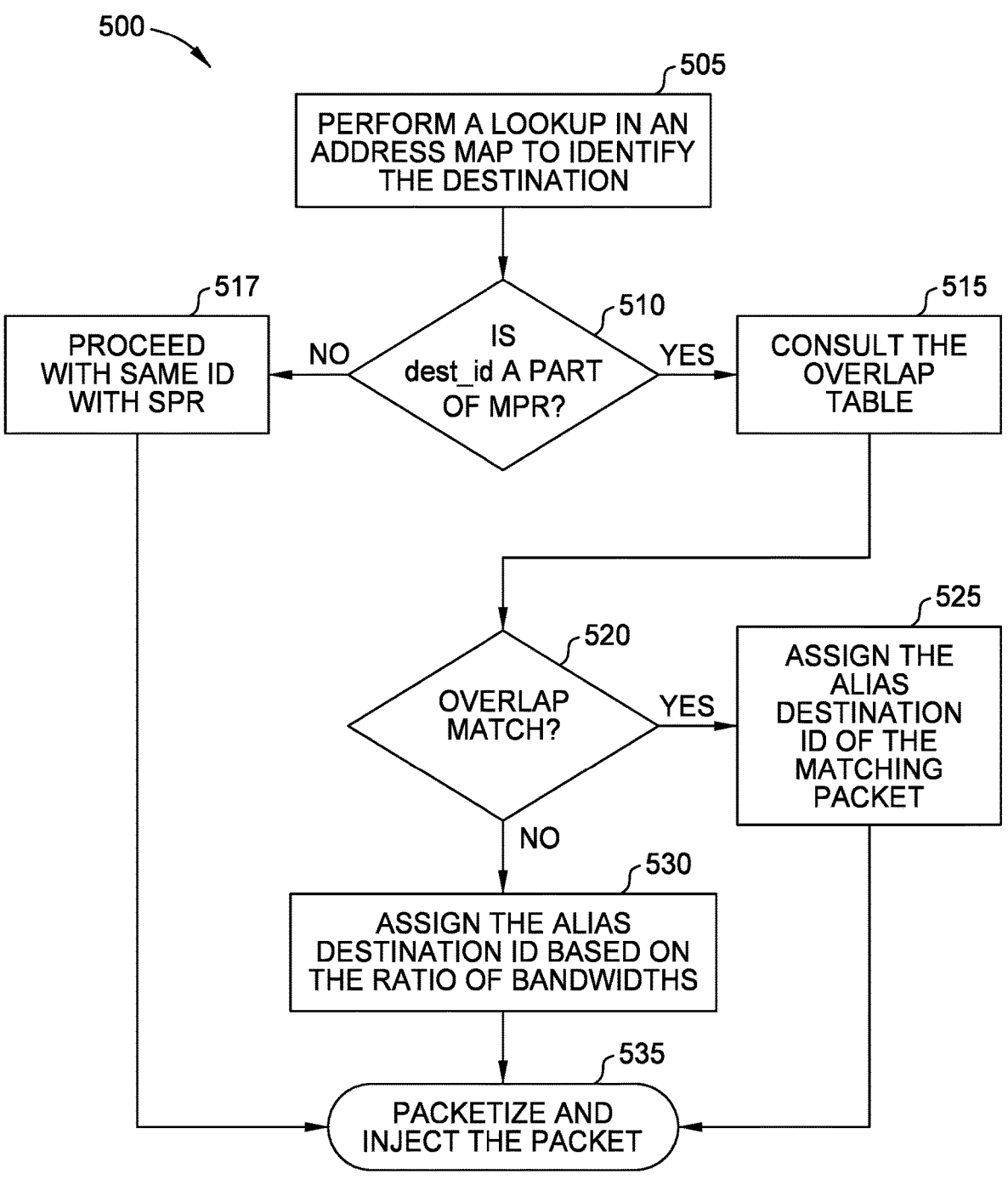
FIG. 5 is a flowchart for performing MPR, according to an example.
Figure 6:
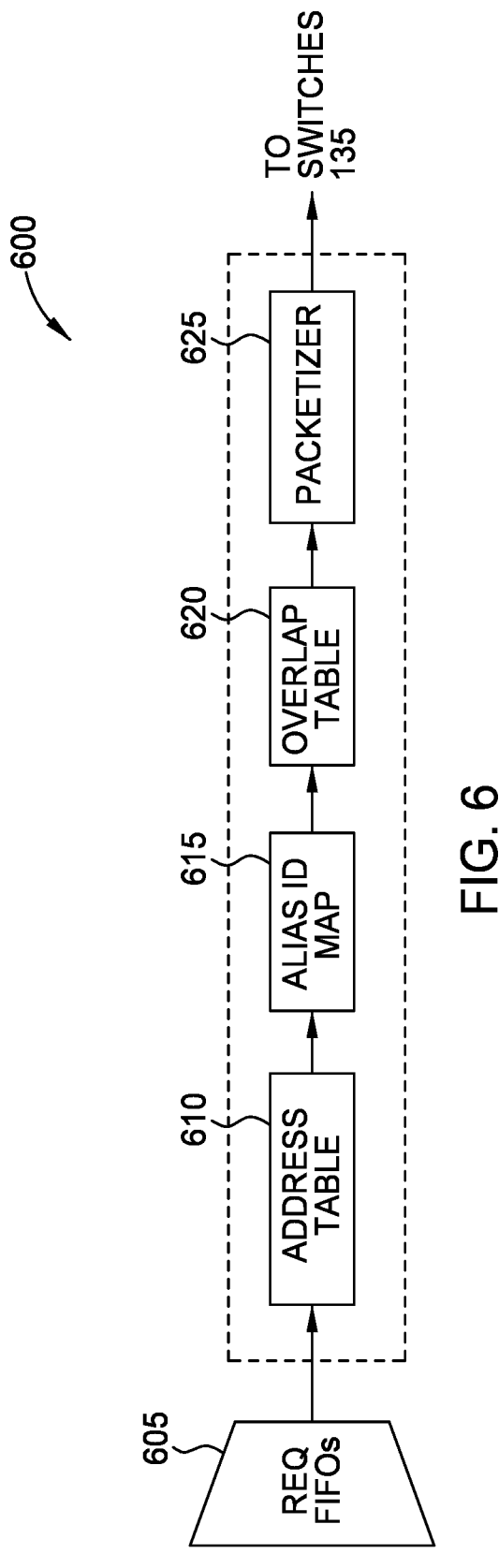
FIG. 6 illustrates packet processing circuitry in an ingress logic block, according to an example.

Returning to block 320, if the ingress logic block does not service multiple components with separate IDs, the method 300 proceeds to block 320 to perform flow splitting which is discussed in FIGS. 5 and 6.

However, if the ingress logic block does service multiple components with separate IDs, the method 300 proceeds to block 325 where the router determines whether there are paths that satisfy BW for each of the components. Using FIG. 2B as an example, assume that component 220A needs to use 50% of the bandwidth of one of the links L0-L2. In that case, none of the links would have sufficient available bandwidth for the traffic generated by the component 220A. Put differently, the NoC does not have a respective link that has sufficient bandwidth to service the traffic generated by each one of the components 220, In that case, the method 300 proceeds to block 320 where flow splitting can be performed (as will be discussed below).

However, if the component 220A and the component 220B need to use 34% or less of the bandwidth of a link, then there is sufficient available bandwidth in the links. For example, L0 can be used to service the traffic generated by the component 220A as shown by path 210 while L2 can be used to service the traffic generated by the component 220B as shown by path 215, Thus, in this example, the router has identified paths that can be assigned to service traffic for each component 220.

The method 300 then proceeds to block 330 where the router generates an alias ID for each path identified at block 325. In one embodiment, the alias IDs can be used to represent different paths to reach the same egress logic block. One alias ID can be used by the traffic generated by the component 220A in FIG. 2B while another alias ID can be used by the traffic generated by the component 220B. Thus, the traffic for component 220A uses the path 210 to reach the egress logic block 140E while the traffic for component 220B uses the path 215 to reach the egress logic block 140B. This guarantees that the traffic generated for one of the components 220 arrives in order at the egress logic block 140B. However, the combined traffic for the components 220A and 220B may arrive out of order relative to their transmission order at the ingress logic block 115B due to the different latencies in the paths 210 and 215 but this does not violate the communication protocol used by the NoC.

At block 335, the router configures a separate route for each alias ID. In one embodiment, the router configures the route in the NoC by updating routing tables in the switches 135 in FIG. 28. Thus, when the switch 135C receives a packet from the ingress logic block 115B, the switch 135C can evaluate the alias ID in the packet (i.e., the destination ID). If the packet has the alias ID for the path 210, then the routing table indicates that the next hop is to the switch 135A, but if the packet as the alias ID for the path 215, the routing table indicates the next hop is to the switch 135E. In this manner, the router can generate the routing tables in each of the switches 135 to support MPR.

Advantageously, this MPR technique does not require additional hardware in the switches 135, although they may have slightly larger routing tables in memory since an egress logic block 140 can be associated with multiple alias IDs when MPR is used.

In one embodiment, the method 300 can be performed for each ingress logic block in the NoC. Further, if an ingress logic block has connections to multiple egress logic blocks, the method 300 can be performed for each of these connections.

Figure 4:
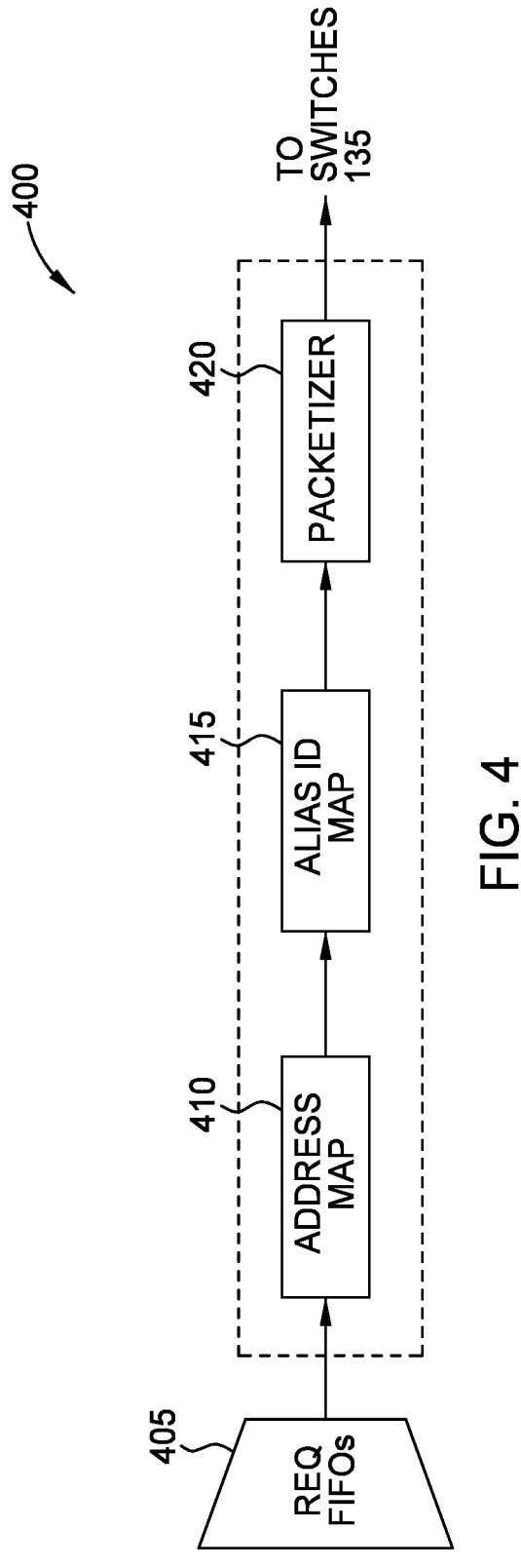
FIG. 4 illustrates packet processing circuitry in an ingress logic block, according to an example.

FIG. 4 illustrates packet processing circuitry 400 in an ingress logic block, according to an example. The packet processing circuitry 400 can be used to perform the MPR techniques described in the method 300. As shown, the circuitry 400 includes a request FIFO 405 which stores requests received from upstream circuitry (e.g., the components 220 in FIG. 2B). An address map 410 receives the requests (or transactions) from the FIFO 405 and contains the address range and corresponding destination IDs for the egress logic blocks. In one embodiment, the ingress logic block identifies the destination ID by performing a lookup in the address map 410 using addresses in the requests (e.g., packets).

The destination ID is then sent to an alias ID map 415 which stores the mapping of destination IDs to their respective alias IDs that were generated at block 330 of the method 300. The alias ID map 415 can use the destination ID and the ID of the component submitting the request (e.g., the AXI ID), to identify a corresponding alias ID. That is, a hit in the alias ID map 415 generates the alias ID for the request (or more specifically, a packet corresponding to the request).

The alias ID and the request is then sent to a packetizer 420 which generates a packet for the request that contains the alias ID. The resulting packet can then be transmitted to a switch 135 in the NoC which, as discussed above, has a routing table that includes the alias IDs for determining how to route the packets corresponding to different alias IDs (and different components) on different routes or paths to reach the same egress logic block.

FIG. 5 is a flowchart of a method 500 for performing MPR, according to an example. In one embodiment, the method 500 describes flow splitting. In one embodiment, the method 500 is performed when the NoC does not have multiple master components (e.g., block 315 in FIG. 3) or when the NoC does not have links with sufficient bandwidth to support the traffic from each master components (e.g., block 325 in FIG. 3). However, in another embodiment, the method 500 can be used in all cases. That is, the flow splitting described in method 500 can be a general use case that can be applied to any situation when a single route between an ingress and egress logic block that has sufficient bandwidth cannot be identified.

At block 505, the ingress logic block performs a lookup in an address map to identify a destination of a received packet. The address map can stored destination IDs for each destination supported by the NoC.

At block 510, the ingress logic block uses the identified destination to determine whether that destination is part of MPR. In one embodiment, the ingress logic block queries an alias map which determines whether a particular destination ID corresponds to multiple alias destination IDs. If not, then SPR routing is used to route data from that ingress logic block to the destination. In that case, the method 500 proceeds to block 515 where the ingress logic block uses the destination ID to route the data through the NoC via SPR.

However, if the ingress logic block determines the destination ID is associated with multiple alias destination IDs, the method instead proceeds to block 515 where the ingress logic block queries an overlap table to determine if there is a data dependency between the current packet and previously sent packets that are still in transit to the destination. In one embodiment, the overlap table stores information regarding in-service packets (e.g., a packet that has already been transmitted by the ingress logic block but a confirmation of receipt has not yet been received from the egress logic block) that the ingress logic block has transmitted to the egress logic block corresponding to each destination. The overlap table can stored the addresses corresponding to these packets. The ingress logic block can compare the address (or address range) to the address or address range of the packets stored in the overlap table.

At block 520, the ingress logic block determines whether the address or address range of the current packet is the same or overlaps with the address or address range of any in-service packets, indicating there is a match. For example, if the current packet has an address range of 0-16 and an in-service packet to the same destination has an address range of 16-32, then the addresses do not overlap (i.e., there is no match). However, if the current packet has an address range of 0-16 and an in-service packet has an address range of 10-15, then the address ranges overlap and there is a match.

In this embodiment, when the addresses at least partially overlap, this means that the packets should arrive at the egress logic block in the order they were transmitted by the ingress logic block. That is, because the packets are accessing overlapping memory, it is important that these packets are handled at the destination in the order they were transmitted by the ingress logic block. For example, assume a first packet transmitted by the ingress logic block changes the data corresponding to its address range and a second, subsequently transmitted packet reads that data. If the first packet is transmitted to the egress logic block using a higher latency path through the NoC than the second packet, the second packet may reach the egress logic block before the first packet. Thus, the read performed by the second packet will read the "stale" data since it will be processed first by the destination.

In contrast, if the first and second packets do not overlap, then they can be performed by the destination in any order since there is no data dependency between the packets. That is, order does not matter to in-service packets that have non-overlapping address ranges.

If the ingress logic block determines that the current packet overlaps with an in-service packet, the method 500 proceeds to block 525 where the ingress logic block assigns the alias destination ID of the matching in-service packet to the current packet. By assign the same alias destination ID, this ensures the current packet uses the same path that the in-service packet followed through the NoC to reach the egress logic block, thereby guaranteeing the packets are received in order at the egress logic block. This ensures the packets are processed in order by the destination, and thus, any data dependency between the packets is handled correctly.

Conversely, if there is no match, the method 500 proceeds to block 530 where the ingress logic block assigns the alias destination ID based on the ratio of bandwidths. For example, assume the ingress logic block has three different links to the egress logic block where these paths have 33%, 33%, and 66% of the bandwidth assigned to service the data connection between the ingress and egress logic blocks. Assuming these three paths have the same total bandwidth, in that case, the ingress logic block assigns two packets to use the third path for every one packet it assigns to the first and second paths. Thus, the ingress logic block can use any assignment technique (e.g., round robin) to assign the packets alias IDs so that the desired ratio of bandwidth is achieved. This can also consider the packets that are forced to use the same path due to having overlapping addresses. For example, if the ingress logic block sends two subsequent packets on the first path because they have overlapping address, it may send the next two packets on the second path and the next four packets on the third path (assuming they do not have overlapping addresses) to maintain the desired bandwidth usage ratio between the paths.

At block 535, the ingress logic block packetize and inject the packet into the switching network. That is, the ingress logic block can add the corresponding alias destination ID (or the actual destination ID in the case of SPR) into the packet and send the packet to the switch connected to the ingress logic block. As discussed above, the routing tables in the switches can be configured to recognize the actual and alias destination IDs (if MPR is enabled) so that the packets can be routed on the correct paths to the egress logic block.

FIG. 6 illustrates packet processing circuitry 600 in an ingress logic block, according to an example. The packet processing circuitry 600 can be used to perform the MPR techniques described in the method 500. As shown, the circuitry 600 includes a request FIFO 605 which store requests received from upstream circuitry (e.g., the components 220 in FIG. 2B). An address map 610 receives the requests (or transactions) from the FIFO 605 and contains the address range and corresponding destination IDs for the egress logic blocks. In one embodiment, the destination ID is identified by performing a lookup in the address map 610 using addresses in the requests (e.g., packets).

The destination ID is then sent to an alias ID map 615 which stores the mapping of destination IDs to their respective alias IDs when MPR was enabled in the NoC. The alias ID map 615 can use the destination ID to identify a corresponding alias ID. That is, a hit in the alias ID map 615 generates the alias ID for the request (or more specifically, a packet corresponding to the request). Thus, at block 510 of FIG. 5, the ingress logic block can query the alias ID map 615 to determine if the destination ID is part of MPR (i.e., the destination ID has multiple alias destination IDs).

The circuitry 600 also includes an overlap table 620 which tracks the in-service packets previously transmitted by the ingress logic block. If the ingress logic block transmits data to multiple destinations, then the overlap table 620 can track the in-service packets for each of those destinations. Once a packet is no longer in-service (e.g., the egress logic block from that destination has acknowledge the packet), then the packet may be removed from the overlap table 620.

As discussed above, the ingress logic block can use the overlap table 620 at blocks 515 and 520 of FIG. 5 to determine whether a current packet matches one of the in-service packets stored in the overlap table 620 (e.g., the address range of the current packet overlaps the address range of one of the in-service packets going to the same destination). If so, this indicates the current packet should be sent on the same path (e.g., assigned the same alias ID) as the in-service packet so that order is preserved. If not, the ingress logic block can assign an alias destination ID in order to satisfy the desired bandwidth usage ratio of the paths used to reach the egress logic block.

The alias ID and the request is then sent to a packetizer 625 which generates a packet for the request that contains the alias ID. The resulting packet can then be transmitted to a switch 135 in the NoC which, as discussed above, has a routing table that includes the alias destination IDs for determining how to route the packets corresponding to different alias IDs on different routes or paths to reach the same egress logic block.

Note that the process in FIGS. 4 and 6 for assigning alias IDs for routing data to the egress logic blocks can applied to the egress logic blocks which assign source IDs to route data to the ingress logic blocks. That is, the source IDs of the ingress logic blocks can also be aliased to route the packets back to the source in the respective paths.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An integrated circuit, comprising:
a first circuit element;
a second circuit element; and
a network on a chip (NoC) configured to communicatively couple the first and second circuit elements, the NoC configured to:
    receive, at an ingress logic block, a packet from the first circuit element to be transmitted to the second circuit element,
    determine that a destination of the packet uses multi-path routing (MPR) in the NoC, and
    assign an alias destination ID corresponding to the destination based on a desired bandwidth usage ratio of a plurality of paths used to transmit data from the ingress logic block to an egress logic block in the NoC, wherein each of the plurality of paths between the ingress logic block and the egress logic block has a different alias destination ID.

2. The integrated circuit of claim 1, wherein the NoC is configured to:
receive, at the ingress logic block, a second packet from the first circuit element to be transmitted to the second circuit element; and
upon determining that an address of the packet matches an address of an in-service packet previously transmitted to the destination, assign a same alias destination ID to the second packet that was assigned to the in-service packet so that the second packet uses the same path through the NoC to reach the egress logic block as the in-service packet.

3. The integrated circuit of claim 2, wherein the ingress logic block comprises an overlap table configured to store address ranges of in-service packets being transmitted from the ingress logic block to the egress logic block.

4. The integrated circuit of claim 2, wherein assigning the same alias destination ID to the second packet as the in-service packet ensures the second packet and the in-service packet arrive at the egress logic block in the same relative order as the second packet and the in-service packet were transmitted from the ingress logic block.

5. The integrated circuit of claim 1, wherein the desired bandwidth usage ratio is based on a percentage of a bandwidth in each of the plurality of paths the ingress logic block is permitted to use to transmit packets to the egress logic block, wherein the percentage of the bandwidth the ingress logic block is permitted to use in each of the plurality of paths is less than 100 percent.

6. The integrated circuit of claim 1, wherein the NoC is configured to, before determining that the destination of the packet uses MPR:
perform a lookup in an address map in the ingress logic block to identify the destination of the packet.

7. The integrated circuit of claim 1, wherein the NoC is configured to:
use the alias destination ID to route the packet through a plurality of interconnected switches to reach the egress logic block.

8. A method, comprising:
receiving, at an ingress logic block of a NoC, a packet from a first circuit element to be transmitted to a second circuit element coupled to the NoC;
determining that a destination of the packet uses multi-path routing (MPR) in the NoC; and
assigning an alias destination ID corresponding to the destination based on a desired bandwidth usage ratio of a plurality of paths used to transmit data from the ingress logic block to an egress logic block in the NoC, wherein each of the plurality of paths between the ingress logic block and the egress logic block has a different alias destination ID.

9. The method of claim 8, further comprising:

receiving, at the ingress logic block, a second packet from the first circuit element to be transmitted to the second circuit element; and upon determining that an address of the packet matches an address of an in-service packet previously transmitted to the destination, assigning a same alias destination ID to the second packet that was assigned to the in-service packet so that the second packet uses the same path through the NoC to reach the egress logic block as the in-service packet.

10. The method of claim 9, wherein the ingress logic block comprises an overlap table configured to store address ranges of in-service packets being transmitted from the ingress logic block to the egress logic block.

11. The method of claim 9, wherein assigning the same alias destination ID to the second packet as the in-service packet ensures the second packet and the in-service packet arrive at the egress logic block in the same relative order as the second packet and the in-service packet were transmitted from the ingress logic block.

12. The method of claim 8, wherein the desired bandwidth usage ratio is based on a percentage of a bandwidth in each of the plurality of paths the ingress logic block is permitted to use to transmit packets to the egress logic block, wherein the percentage of the bandwidth the ingress logic block is permitted to use in each of the plurality of paths is less than 100 percent.

13. The method of claim 8, further comprising, before determining that the destination of the packet uses MPR:

performing a lookup in an address map in the ingress logic block to identify the destination of the packet.

14. The method of claim 8, further comprising:

using the alias destination ID to route the packet through a plurality of interconnected switches to reach the egress logic block.

15. An integrated circuit, comprising:

a first circuit element assigned a first ID;

a second circuit element assigned a second ID different from the first ID; and a NoC comprising:

an ingress logic block configured to receive packets from the first and second circuit elements to transmit through the NoC to a same egress logic block in the NoC;

wherein the ingress logic block is configured to:

assign a first alias destination ID corresponding to a first path through the NoC used by packets received from the first circuit element to reach the egress logic block, and assign a second alias destination ID corresponding to a second path through the NoC used by packets received from the second circuit element to reach the egress logic block.

16. The integrated circuit of claim 15, wherein the packets received from the first circuit element at the ingress logic block are transmitted only via the first path to the egress logic block and the packets received from the second circuit element at the ingress logic block from the second circuit element is transmitted only via the second path to the egress logic block.

17. The integrated circuit of claim 15, wherein the first ID and the second ID are different advanced extensible interface (AXI) IDs.

18. The integrated circuit of claim 15, wherein the first path uses a different set of switches in the NoC to reach the egress logic block than the second path.

19. The integrated circuit of claim 15, wherein the first and second circuit elements are peripheral devices.

20. The integrated circuit of claim 15, wherein the ingress logic block is configured to, before assigning the first and second alias destination IDs:

perform a lookup in an address map in the ingress logic block to identify destinations of the packets received from the first and second circuit elements.

* * * * *